United States Patent [19]
Banfi

[11] 3,976,933
[45] Aug. 24, 1976

[54] METHOD AND CIRCUIT FOR IN-SERVICE TESTING OF AN ELECTRO-MAGNETICALLY ACTUATED COMPONENT

[75] Inventor: Antonio Banfi, Vimercate, Italy

[73] Assignee: Societa Italiana Elettronica S.p.A., Milan, Italy

[22] Filed: Dec. 20, 1974

[21] Appl. No.: 534,727

[30] Foreign Application Priority Data
Feb. 20, 1974  Italy .................................. 48492/74

[52] U.S. Cl. .......................... 324/28 R; 324/28 CB; 324/28 CR
[51] Int. Cl.² ........................................ G01R 31/02
[58] Field of Search ......... 324/28 R, 28 CB, 28 CR, 324/28 SE

[56] References Cited
UNITED STATES PATENTS

| | | | |
|---|---|---|---|
| 2,888,639 | 5/1959 | Petermiehl | 324/28 CB |
| 3,217,243 | 11/1965 | Franklin | 324/28 R |
| 3,548,301 | 12/1970 | Zutkis | 324/28 R |
| 3,867,686 | 2/1975 | St-Jean | 324/28 CB |

Primary Examiner—Siegfried H. Grimm
Assistant Examiner—Michael J. Tokar
Attorney, Agent, or Firm—Ostrolenk, Faber, Gerb & Soffen

[57] ABSTRACT

A method and circuit for in-service testing of the winding of electromagnetic actuators and the like having a known effective response time and being connected between an energy supply and actuating circuit means, including driving the input of the actuating circuit means with a test signal similar to the effective actuating signal and limited to a duration shorter than the effective response time of the actuator; and activating return circuit means between the winding and the output of the actuating circuit means, by the winding current flow upon termination of the test signal whereby the flow of component self-induction current through the return circuit means furnishes a pulse signal output for checking the efficiency and integrity of the actuating circuit means, the electromagnetic actuator, and the electrical circuit connections therebetween without producing an erroneous intervention. An effective intervention may be produced by overriding the test signal with a control intervention signal.

7 Claims, 2 Drawing Figures

METHOD AND CIRCUIT FOR IN-SERVICE TESTING OF AN ELECTRO-MAGNETICALLY ACTUATED COMPONENT

BACKGROUND OF THE INVENTION

This invention relates to methods and circuitry for testing electromagnetic devices and more particularly to a novel method and circuitry for testing electromagnetic actuators even while they are in service, while allowing effective control intervention during such testing.

Electromagnetic devices, such as solenoids, relays, contactors, electrovalves and the like, are normally tested before installation. However, there is no assurance that devices passing the test will operate for any determinable length of time in its actual environment of controlling circuitry and equipment loading. Equipment which uses such electromagnetic actuators in a critical application or protection function may be damaged, destroyed or rendered ineffective if the actuator fails to operate in the desired manner. One example would be a power supply, in which relay contacts are connected in series with the output and are actuated to open and break the connection when a load draws a current in excess of a certain percentage above a set maximum working current. The failure of that relay to actuate, when a control signal causes current to flow in an electromagnetic coil, will result in excessive heating and potentially permanent damage of the components. The non-functioning equipment must be repaired or replaced. In either case, the equipment is out of service for some amount of time.

BRIEF SUMMARY OF THE INVENTION

It is desirable to test the efficiency of an electromagnetic actuator, the control circuit with which the component is used and the connections therebetween without producing mechanical wear or spurious control interventions while the component remains installed and capable of responding to normal in-service control actuating signals.

In accordance with the invention and to accomplish these functions, the method and circuitry comprises: driving the input of the component actuating circuit means with a test actuating signal similar to the effective actuating signal and of a duration shorter than the effective response time of the electromagnetically actuated component; applying temporarily a control pulse in the actuating direction to the component winding; providing a normal signal connection to the input of the component actuating circuit means in parallel with the test actuating signal connection; and connecting return circuit means to the junction between the component and the output of the component actuating circuit means, whereby the flow of component self-induction current through the return circuit means furnishes a pulse signal output for checking the electromagnetic efficiency of the component, the actuating circuit means and the interconnection therebetween.

The electromagnetically actuated component testing method and circuitry just described has the advantages of permitting an efficiency check of the in-service component to be made while the equipment is in use, while allowing effective control intervention and actuation of the component to be made at any necessary time, including the time during which the check is being carried out.

Accordingly, it is a primary object of the invention to permit testing of an electromechanically actuated component which is installed and in service in equipment.

It is another object of the invention to permit such testing without increasing the mechanical wear of the component.

It is a further object to permit such testing while allowing effective control intervention and actuation of the component to be made at any time, including the time during which the test is being made.

It is a still further object of the invention to provide circuitry means which enables such testing.

These and other objects of the invention will become apparent from the following description of the accompanying drawings.

DETAILED DESCRIPTION OF THE INVENTION

Figure 1:
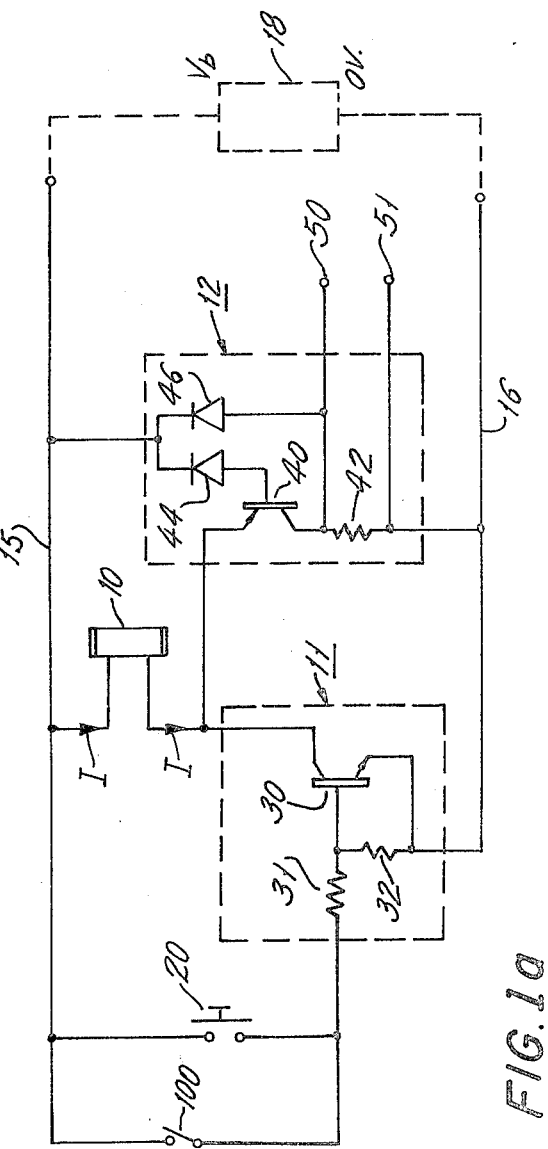
FIG. 1 is a schematic representation of circuitry in accordance with the invention and of an energy source and signal formation means with which it is used for testing a normally de-energized actuator.

In the schematic drawing, the electromagnetic actuating coil 10 of a component to be tested has one terminal thereof connected in common with the actuating circuit means 11 and return circuit means 12 and has its opposite terminal connected to the energy supply bus 15. An energy source 18 applies a potential of $V_b$ volts across bus 15 and return bus 16.

Figure 1A:
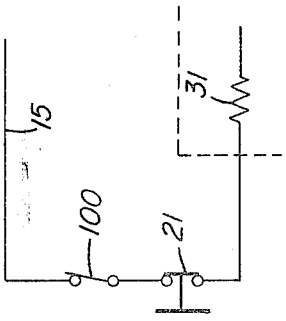
FIG. 1a is a schematic representation of a modification to the signal formation means of FIG. 1, for testing a normally energized actuator.

Effective intervention of the electromagnetically actuated component requires that either a current be made to flow through the component winding 10 in the direction indicated by arrow I or, conversely, that an existing current flow through winding 10 in the direction of arrow I be interrupted and made to cease. In the former case, the normally de-energized component is energized by the closure of a normally open switch 20 (FIG. 1) which applies a voltage to the input of the normally non-conducting actuating circuit means 11. The applied voltage is of a magnitude sufficient to cause the actuating circuit means 11 to change to a conducting state, allowing the flow of current from the supply bus 15 through the component winding 10 and the saturated activating circuit means 11 to the return bus 16 and energizing the component to complete the effective control intervention. In the latter case, the normally energized component is electromagnetically activated by the opening of a normally closed switch 21 FIG. 1a) which removes a voltage from the input of the normally conducting actuating circuit means 11. The removal of the input voltage causes the actuating circuit means 11 to change to a non-conducting state, preventing the flow of current from the supply bus 15 through the component winding 10 to the return bus 16 and de-energizing the component to complete the effective control intervention. It should be understood that switches 20 and 21 are shown as being of the manually operable type for the purposes of simplicity but may be solid state devices, especially due to their ability to provide very short operating time intervals.

Any electromagnetically actuated component may be characterized, among other parameters, by two important factors: the effective response time, $T_r$, for the attraction or the release of the moveably actuated component part, and the coil inductance, L.

In a preferred circuit embodiment incorporating the method of this invention, actuator winding 10 is in electrical series connection with the actuating circuit means 11, which includes a transistor switch 30, whose collector is the output of the actuating circuit means 11 and whose emitter is electrically connected to return bus 16. Resistors 31 and 32 form a voltage divider to establish the voltage level applied to the base of transistor switch 30. The output of the activating signal means 11, that is, the collector of the transistor switch 30, is connected to one terminal of the actuating coil 10. The input of the return circuit means 12 is electrically connected to the junction between the collector of the transistor switch 30 and the actuating winding 10. The return circuit means 12 includes a transistor switch 40, whose emitter is connected to the input thereof and whose collector is connected to return bus 16 through sampling resistor 42. The base and the collector of transistor switch 40 are each electrically connected to the bus 15 through protection diodes 44 and 46, respectively. A pulse signal output terminal 50 is electrically connected to the common junction between the collector of the transistor switch 40, the anode of the collector protection diode 46 and the sampling resistor 42. A pulse signal output return terminal 51 is electrically connected to the return bus 16.

An effective intervention, i.e. a complete actuation, of a normally de-energized electromagnetically actuated component is caused by the application of an effective actuation signal, e.g., the closure of the system switch 100 to complete the circuit branch between bus 15 and the input of acutating circuit means 11, to energize the actuator winding 10 and cause the actuation by the attraction of the movable component parts. The desired test is accomplished by establishing a parallel test input across the normally-open system switch 100 branch by momentarily closing test switch 20 to produce a test input signal of time duration, $T_t$, which is always less than the effective response time, $T_r$, of the component 10. The test signal will saturate actuating circuit means 11 to cause a flow of current through the winding for a time period sufficient to test the component but insufficient to cause the actual movement of the mechanical parts thereof.

When switch 20 is open, transistor 30 does not conduct and no current flows through winding 10. Closing test switch 20 connects the energy supply across resistors 31 and 32, whose values are chosen to cause the base-emitter junction of the transistor switch 30 to be forwardly biased when the test signal is applied thereto. The transistor switch 30 saturates and forms a low resistance path for the flow of current through the component winding 10, in the direction of arrow I. While the transistor switch 30 is conducting, the current $I_e$ through the component winding 10 increases from zero to a maximum value $I_E$ determined by the time $T_t$ and by the parameters of the circuit and the actuating coil 10 stores an energy $W = \frac{1}{2} I_E^2 L$.

After an elapsed time $T_t$, the contacts of test switch 20 are opened and the test signal is removed from the base of transistor 30 causing it to return to the cut-off state and hence to prevent the passage of current from its output to the return bus 16. As soon as the transistor switch 30 is cut off, the stored energy W must be gradually discharged from the actuating winding 10. The sudden cessation of current flow through the activating circuit means 11 forms a self-induced voltage across the inductance of the actuating coil 10. This self-induced voltage also appears between the emitter of the return transistor 40 and the cathode of the base protection diode 44 to forward bias the base-emitter junction causing transistor 40 to conduct. The stored energy W is discharged as a flow of current through the saturated transistor 40 and the sampling resistor 42 to the return bus 16. This flow of current through the sampling resistor 32 progressively decreases from its initial value, $I_E$, to a value of zero and forms a voltage pulse across the sampling resistor 42, which pulse is made available between the test terminals 50 and 51. The output of this separately processable pulse signal denotes that a magnetic flux was present in the actuator winding 10 and that an electromagnetive attraction force had been formed in the component. Once the self-induced voltage across the component winding 10 falls to zero, the return transistor 40 returns to a cut-off state and the output pulse returns to zero volts.

Conversely, an effective intervention of a normally energized electromagnetically actuated component (FIG. 1a) is caused by the application of an effective actuation signal, e.g., the opening of the system switch 100, to de-energize the actuator winding 10 and cause the actuation by the release of the movable component parts. The system switch 100 and the test swtich 21 are both normally closed and the input lead of the bias resistor 31 is electrically connected to the energy supply bus 15, causing the transistor switch 30 to be saturated and a current to flow from the energy supply bus 15 through the actuation winding 10 to the energy return bus 16. The desired test is accomplished by momentarily opening a test switch 21 and forming a test input signal of time, $T_t$, which is always less than the effective response time, $T_r$, of the component 10. The test signal removes the input from the actuating test means 11 causing the transistor switch 30 to be cut-off and stopping the flow of current through the actuator winding 10. The sudden cessation of current through the winding forms a self-induced voltage across the component winding 10 and the electrically parallel connected emitter-base junction of the return transistor 40. The return transistor 40 saturates and the stored energy W is discharged as a flow of current through the saturated transistor 40 and the sampling resistor 42 to the return bus 16. This flow of current causes a voltage pulse to be formed across the sampling resistor 42 and between the test signal terminals 50 and 51 connected thereto. When the contacts of switch 21 are again closed after this time period $T_t$, the actuating circuit means 11 is again saturated and the normal energizing current flows from the energy supply bus 15 through the actuating winding 10 and the actuating circuit means 11 to the energy return bus 16 and the return circuit means 12 returns to a cut-off state. The cessation of current flow through the return circuit means 12 causes the voltage appearing across the sampling resistor 32 and between the test output terminals 50 and 51 to fall to zero volts.

An effective control intervention can be made during the course of the test. In a normally de-energized operating mode (FIG. 1), the effective intervention signal means 100 closes to establish a short circuit path across test switch 20. When the contacts of the switch 20 open at the completion of the test, the parallel connected short circuit of systems switch 100 retains the actuating circuit means 11 and winding 10 in the conductive state whereby the mechanical parts of the component are magnetically moved for as long a period of time as the parallel short circuit is present.

In a normally energized operating mode (FIG. 1a), the effective intervention signal means 100 appears as an open circuit in series electrical connection with the test switch 21. When the contacts of the switch 21 close at the completion of the test, series connected switch 100 has opened and forces the actuating circuit means 11 to remain in a cut-off state whereby no current flows through the actuating winding 10 and the mechanical parts of the component return to their non-energized position for as long a period of time as the system switch 100 is maintained as an electrical open circuit.

The protection diodes 44 and 46 only serve to protect the transistors from overcurrents and overvoltages. When such protection is not necessary, the base protection diode 44 may be replaced by a conductor and the collector protection diode 46 may be replaced by an open circuit.

There has just been described a method and circuitry for the testing of an electromagnetically actuated component, its activating circuit means and the interconnections therebetween, whereby an integrity check is made while the circuitry remains in service in the equipment system and an effective control intervention and actuation of the component may be made at any time, including the time during which the test is made.

The present invention has been described in connection with a preferred embodiment thereof, many variations and modifications will become apparent to those skilled in the art. It is preferred, therefore, that the present invention be limited not by the specific disclosure herein, but only by the appended claims.

What is claimed is:

1. A device for checking the electromagnetic efficiency of an actuator having a control circuit and a known response time to a flow of current in said control circuit, the checking being performed while said actuator is installed and in-service in a system; said system having the capability to provide an effective intervention signal to said actuator control circuit even during the performance of the check on said actuator, said device comprising:

an energy source;

first means having a control input for selectively coupling the energy source to said control circuit of said actuator;

second means for applying a test signal to said control input of said first means, said test signal having characteristics similar to the characteristics of said effective intervention signal but having a time duration limited to a time interval shorter than the response time of said electromagnetic actuator to prevent an effective actuation from occurring solely responsive to the application of said test signal; and return circuit means responsive to a self-induction voltage developed by the control circuit of said electromagnetic actuator when said first means decouples the energy source from said actuator, for discharging the energy stored in said control circuit; said return circuit means including third means for developing a pulse signal responsive to a current generated by said self-induction voltage to indicate the change in the electromagnetic state of said control circuit of said actuator to ascertain the efficiency of said actuator, said control circuit, and said first and second means;

each of said test and effective intervention signals being independently coupled to said control input to allow said effective control signal from said system to actuate said first means and said actuator even when said second means applies said test signal to said control input, whereby an effective intervention signal whenever received from said system will completely actuate said actuator even during the performance of the in-service check thereof.

2. The device according to claim 1, wherein said first means is a transistor.

3. The device of claim 1, wherein said return circuit means comprises a transistor.

4. A device for checking the winding of electromagnetic actuators and the like and whose response times for an effective control intervention are a known predetermined value, comprising:

a source of energy;

first means coupled between said winding and said energy source and having a control input responsive to a signal for selectively energizing and deenergizing said winding when respectively driven to a first and a second state;

signal generating means for applying a test signal whose time duration is less than the response time of said winding for controlling the time interval of the test imposed on said winding to prevent said effective control intervention from occurring solely responsive to the application of said test signal;

second means coupled to said winding and being normally non-conductive;

said second means having a control input responsive to a self-induction voltage developed by said winding to render said second means conductive for discharging a quantity of energy stored in said winding; and means in circuit with said second means for developing a measurable pulse signal representative of the discharge of said quantity of stored energy and of the operating condition of said winding.

5. The device of claim 4, further comprising means coupled to said first means control input in common with said signal generating means and capable of overriding said test signal for enabling said winding to produce an effective control intervention even during a test cycle.

6. The device of claim 4, wherein said first means comprises a transistor having its emitter-collector circuit coupled between said winding and said energy source.

7. The device of claim 4, wherein said second means comprises a transistor having its base-emitter circuit coupled across said winding.

* * * * *